United States Patent [19]
Liu et al.

[11] Patent Number: 6,069,578
[45] Date of Patent: May 30, 2000

[54] METHOD FOR AUTOMATIC ADJUSTMENT OF SAMPLING PHASE

[75] Inventors: Stephen Liu; Tai-Hsin Chu; Rong-Tai Wu, all of Tao-Yuan Hsien, Taiwan

[73] Assignee: Quanta Computer, Inc., Taiwan

[21] Appl. No.: 09/177,426

[22] Filed: Oct. 22, 1998

[51] Int. Cl.[7] .............................. H03L 7/00; H03M 1/00
[52] U.S. Cl. .......................................... 341/122; 348/536
[58] Field of Search ................................... 341/122, 123; 348/536, 537, 175

[56] References Cited

U.S. PATENT DOCUMENTS

| | | | |
|---|---|---|---|
| 4,635,097 | 1/1987 | Tatami | 358/13 |
| 5,406,329 | 4/1995 | Kashimura et al. | 348/175 |
| 5,844,436 | 12/1998 | Altmann | 327/156 |

*Primary Examiner*—Michael Tokar
*Assistant Examiner*—Peguy JeanPierre
*Attorney, Agent, or Firm*—Fish & Richardson P.C.

[57] ABSTRACT

A method for automatic adjustment of sampling phase includes the steps of: (a) setting a predetermined number of test phase divisions for each of a plurality of sampling pulses from a sampling circuit; (b) controlling the sampling circuit to sample an analog test signal within a sampling period using the sampling pulses, determining an active sampled data length corresponding to each of the test phase divisions of the sampling pulses by detecting start and end of the analog test signal for each of the test phase divisions of the sampling pulses, and detecting at least one set of consecutive ones of the test phase divisions that have a shortest active sampled data length corresponding thereto; (c) determining an optimum test phase as a central one of the test phase divisions in the detected set that includes a largest number of the consecutive ones of the test phase divisions; and (d) providing the optimum test phase to the sampling circuit to enable the sampling circuit to perform sampling phase adjustment based on the optimum test phase received thereby.

6 Claims, 9 Drawing Sheets

| TEST PHASE DIVISION | ACTIVE DATA LENGTH | TEST PHASE DIVISION | ACTIVE DATA LENGTH |
|---|---|---|---|
| 0 | 1024 | 16 | 1024 |
| 1 | 1024 | 17 | 1024 |
| 2 | 1024 | 18 | 1025 |
| 3 | 1025 | 19 | 1025 |
| 4 | 1025 | 20 | 1025 |
| 5 | 1025 | 21 | 1025 |
| 6 | 1025 | 22 | 1025 |
| 7 | 1025 | 23 | 1025 |
| 8 | 1024 | 24 | 1024 |
| 9 | 1024 | 25 | 1024 |
| 10 | 1024 | 26 | 1024 |
| 11 | 1025 | 27 | 1024 |
| 12 | 1024 | 28 | 1024 |
| 13 | 1024 | 29 | 1024 |
| 14 | 1024 | 30 | 1025 |
| 15 | 1024 | 31 | 1024 |

FIG.3E

| n | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|----|----|----|----|----|----|----|----|----|----|----|----|----|----|----|----|----|----|----|----|----|----|
| Ph_Result[n] | 1 | 1 | 1 | 0 | 0 | 0 | 0 | 0 | 1 | 1 | 1 | 0 | 1 | 1 | 1 | 1 | 1 | 1 | 0 | 0 | 0 | 0 | 0 | 0 | 1 | 1 | 1 | 1 | 1 | 1 | 0 | 1 |

| SETNO | START[SET NO] | LENGH [SET NO] |
|---|---|---|
| 0 | 0 | 0 |
| 1 | 0 | 3 |
| 2 | 8 | 3 |
| 3 | 12 | 6 |
| 4 | 24 | 6 |
| 5 | 31 | 1 |

| SETNO | START[SET No] | LENGH[SET No] |
|---|---|---|
| 0 | 0 | 0 |
| 1 | 0 | 1 |
| 2 | 8 | 3 |
| 3 | 12 | 6 |
| 4 | 24 | 6 |
| 5 | 31 | 4 |

METHOD FOR AUTOMATIC ADJUSTMENT OF SAMPLING PHASE

BACKGROUND OF THE INVENTION

1. Field of the Invention

The invention relates to a method for automatic adjustment of sampling phase, more particularly to a method of the aforementioned type that obviates the need for a particular reference image during adjustment.

2. Description of the Related Art

During the analog-to-digital conversion stage of an image processing operation, if the sampling phase is inaccurate, the resultant image will be blurry and shaky such that a picture of clear quality cannot be obtained. Since a good phase value varies in view of different signal factors (such as rising time, falling time and ringing phenomenon), adjustment of the sampling phase is a relatively complex procedure.

There are two methods commonly employed in the adjustment of analog-to-digital sampling phase in video applications. In the first method, based on what is seen by the operator, adjustment is performed manually until shaking of the image is eliminated, and a stable image is obtained. In the second method, a particular reference image is downloaded to permit automatic adjustment. However, different reference images must be downloaded when adjusting monitors of different resolutions. Since the selection of an appropriate reference image involves some skill, use of the second method by an unskilled operator will involve a great deal of inconvenience.

SUMMARY OF THE INVENTION

Therefore, the object of the present invention is to provide a fast and convenient method for automatic adjustment of sampling phase that obviates the need for a particular reference image during adjustment.

According to the present invention, a method for automatic adjustment of sampling phase comprises:

(a) setting a predetermined number of test phase divisions for each of a plurality of sampling pulses from a sampling circuit;

(b) controlling the sampling circuit to sample an analog test signal within a sampling period using the sampling pulses, determining an active sampled data length corresponding to each of the test phase divisions of the sampling pulses by detecting start and end of the analog test signal for each of the test phase divisions of the sampling pulses, and detecting at least one set of consecutive ones of the test phase divisions that have a shortest active sampled data length corresponding thereto;

(c) determining an optimum test phase as a central one of the test phase divisions in the detected set that includes a largest number of the consecutive ones of the test phase divisions; and (d) providing the optimum test phase to the sampling circuit to enable the sampling circuit to perform sampling phase adjustment based on the optimum test phase received thereby.

In the preferred embodiment, the sampling period is a horizontal scan line period, and the analog test signal is a video signal. Between steps (b) and (c), the number of the consecutive ones of the test phase divisions in a last one of the detected sets is adjusted by adding the number of the consecutive ones of the test phase divisions in a first one of the detected sets thereto when the active sampled data lengths corresponding to first and last ones of the test phase divisions of the sampling pulses are equal to the shortest active sampled data length. Preferably, in step (c), when two or more of the sets detected in step (b) include the largest number of the consecutive ones of the test phase divisions, the optimum test phase is determined as the central one of the test phase divisions in a lattermost one of the detected sets that include the largest number of the consecutive ones of the test phase divisions. Furthermore, between steps (c) and (d), the optimum test phase obtained in step (c) is adjusted by subtracting the predetermined number of the test phase divisions from the optimum test phase when the optimum test phase is greater than the predetermined number of the test phase divisions. The adjusted optimum test phase is subsequently provided to the sampling circuit in step (d).

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
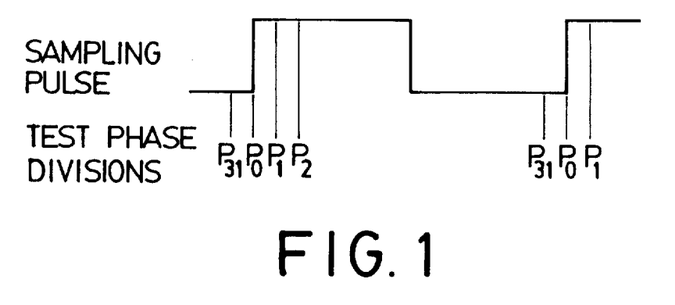
FIG. 1 illustrates test phase divisions of a sampling pulse from a sampling circuit in the preferred embodiment of a method for automatic adjustment of sampling phase in accordance with this invention.
Figure 1A:
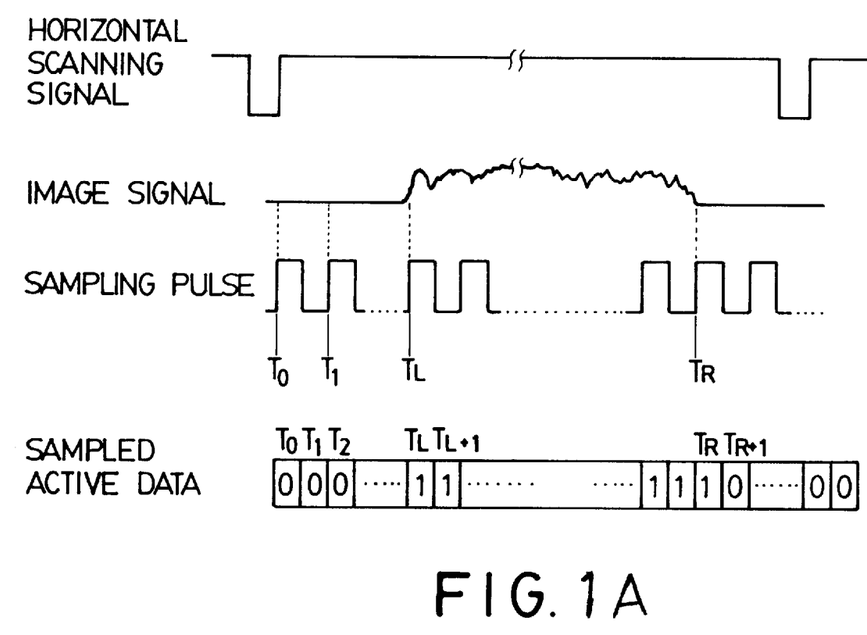
FIG. 1A is a timing diagram illustrating various signals employed in the method of the preferred embodiment.

Referring to FIGS. 1 and 1A, the preferred embodiment of a method for automatic adjustment of sampling phase in accordance with the present invention is shown to comprise the following steps:

Step 1: A predetermined number of test phase divisions is set for each sampling pulse from a sampling circuit 20 (see FIG. 2). In the example of FIG. 1, each sampling pulse is set to have thirty-two test phase divisions P0–P31. Adjacent test phase divisions are thus offset by an angle of (360°/32)= 11.25°.

Step 2: As shown in FIG. 1A, the sampling circuit 20 is controlled by a processing circuit 30 (see FIG. 2) to sample an analog test signal within a sampling period using a plurality of the sampling pulses. In the sampling of video signals, the sampling period is usually a horizontal scan line period. The start and end of the analog test signal is detected for each of the test phase divisions of the sampling pulses so that an active sampled data length corresponding to each of the test phase divisions of the sampling pulses can be determined. Based on the active sampled data lengths that were determined, at least one set of consecutive ones of the test phase divisions that have a shortest active sampled data length corresponding thereto is determined.

Step 3: An optimum test phase is determined to be a central one of the test phase divisions in the detected set that includes a largest number of the consecutive ones of the test phase divisions.

Step 4: The optimum test phase is provided to the sampling circuit 20 to enable the latter to perform sampling phase adjustment based on the optimum test phase received thereby.

Figures 2, 3A:
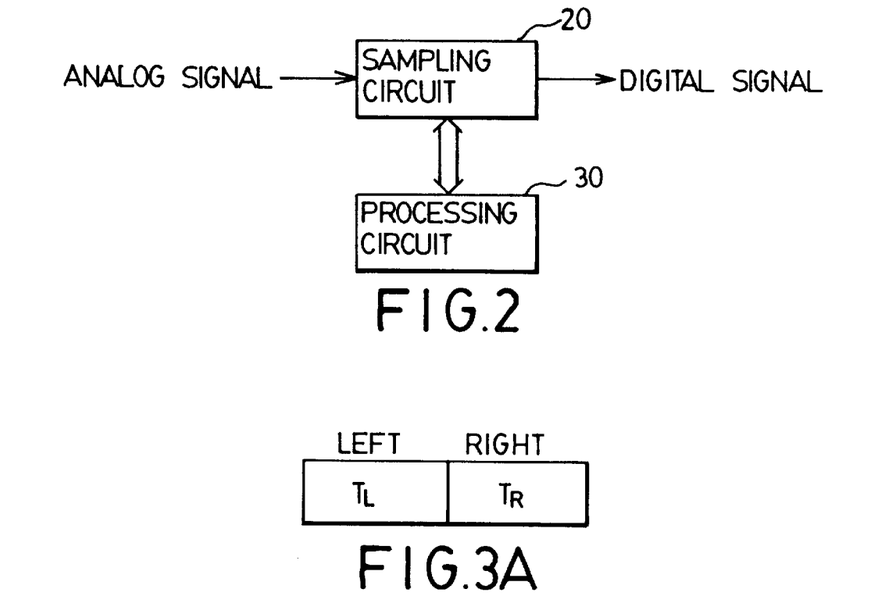
FIG. 2 is a schematic circuit block diagram of an apparatus for performing the method of the preferred embodiment.
FIG. 3A is a schematic diagram illustrating storage of left and right position variables according to the method of the preferred embodiment.

In the following description of the preferred embodiment, each sampling pulse is set to have thirty-two test phase divisions. Referring to FIG. 2, an exemplary apparatus for performing the method of the preferred embodiment is shown to comprise the sampling circuit 20 and the processing circuit 30. The sampling circuit 20 has an input terminal to receive an analog input signal, and an output terminal to provide a digital output signal corresponding to the sampled analog input signal. The operation of the sampling circuit 20 is under the control of the processing circuit 30. The operation of the processing circuit 30 proceeds according to the following subroutines.

Figure 3:
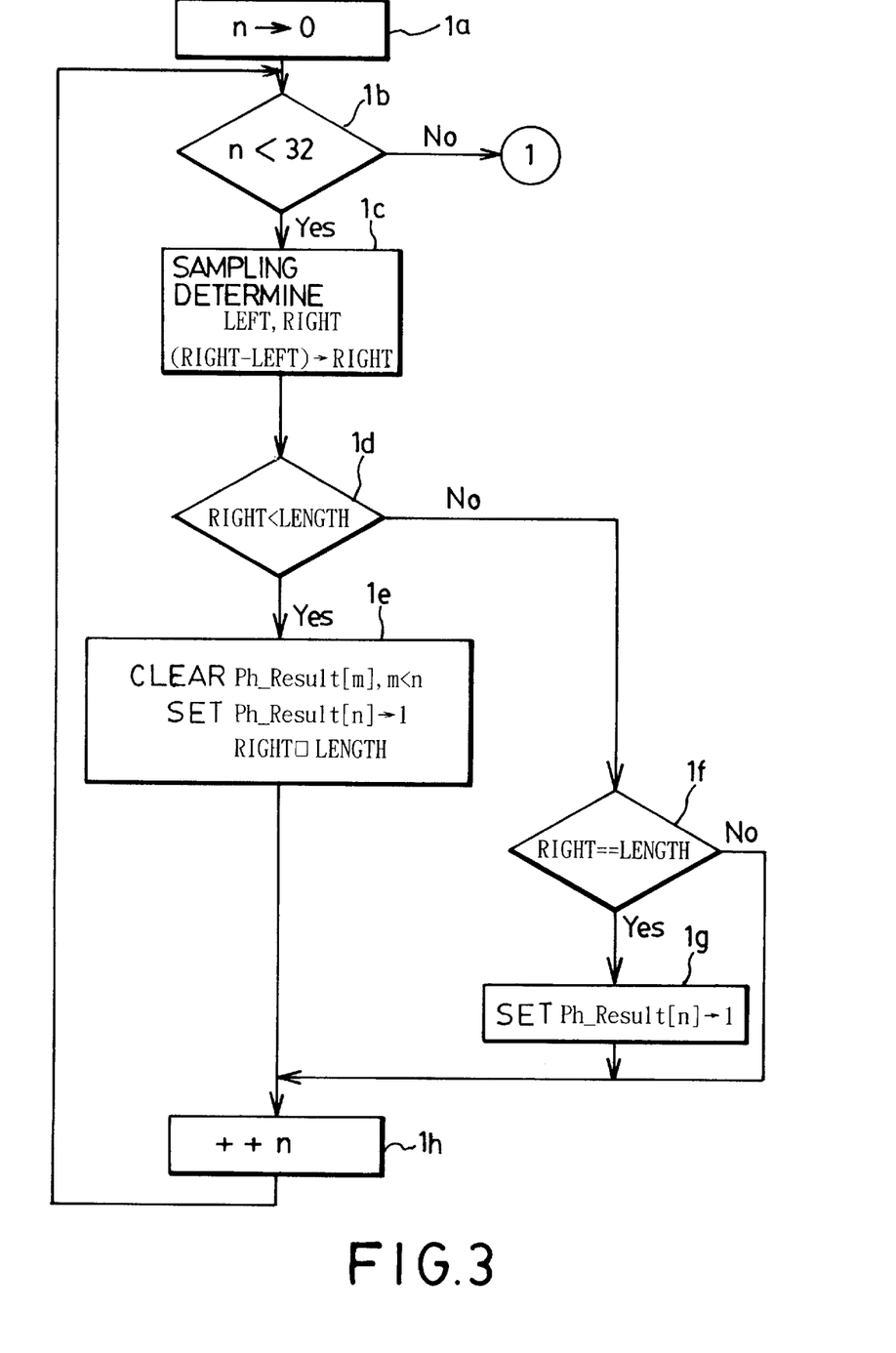
FIG. 3 is a flowchart of a first subroutine of the method of the preferred embodiment.

As shown in FIG. 3, a first subroutine is performed to determine a shortest one of the active sampled data lengths that correspond to the test phase divisions of the sampling pulses.

Figure 3B:
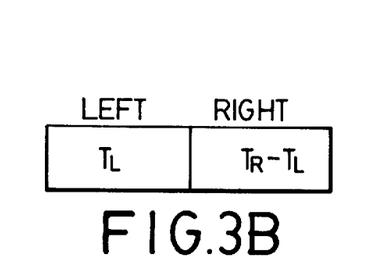
FIG. 3B is a schematic diagram illustrating how the right position variable of FIG. 3A is updated.

Initially, a test phase division count variable (n) is reset to 0 in step 1a. Thereafter, it is determined in step 1b if the count variable (n) is less than thirty-two. If the count variable (n) is less than thirty-two, indicative of the fact that determination of the active sampled data lengths corresponding to all of the test phase divisions of the sampling pulses has yet to be completed, the flow proceeds to step 1c, where the sampling circuit 20 (see FIG. 2) is controlled to sample the analog test signal within the sampling period using the sampling pulses. The start and end of the analog test signal using the test phase division P(n) of the sampling pulses are detected, and the positions of the sampling pulses (TL, TR) that correspond to the detected start and end of the analog test signal are recorded as a left position variable (LEFT) and a right position variable (RIGHT), respectively, as shown in FIG. 3A. Thereafter, the left position variable (LEFT) is subtracted from the right position variable (RIGHT), and the resulting difference, which represents the active sampled data length corresponding to the test phase division P(n) of the sampling pulses, serves as the new right position variable (RIGHT), as shown in FIG. 3B.

Subsequently, in step 1d, it is determined if the right position variable (RIGHT) is less than a length variable (LENGTH). Since the initial value of the length variable (LENGTH) corresponds to the monitor resolution and is expected to be greater than the active sampled data length of the analog test signal, the right position variable (RIGHT) obtained for the test phase division P(0) is determined to be less than the length variable (LENGTH), and the flow proceeds to step 1e.

Figure 3C:
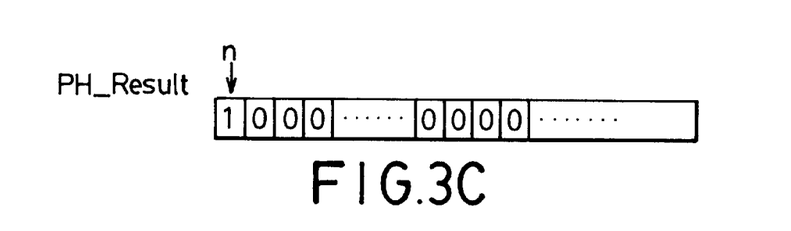
FIG. 3C is a schematic diagram illustrating a shortest length record array according to the method of the preferred embodiment.

In step 1e, a section of a shortest length record array (Ph_Result) is cleared for all entries that precede an nth entry of the record array (Ph_Result). Thereafter, the nth entry of the record array (Ph_Result) is set to 1 (see FIG. 3C), and the right position variable (RIGHT) replaces the length variable (LENGTH). Thus, a "1" in an nth entry of the length record array (Ph_Result) indicates that the active sampled data length corresponding to the test phase division P(n) of the sampling pulses is currently detected to have a shortest active sampled data length.

After step 1e, the flow proceeds to step 1h, where the count variable (n) is incremented by one, and then to step 1b in preparation for the determination of the active sampled data length corresponding to a succeeding one of the test phase divisions of the sampling pulses.

Figure 3D:
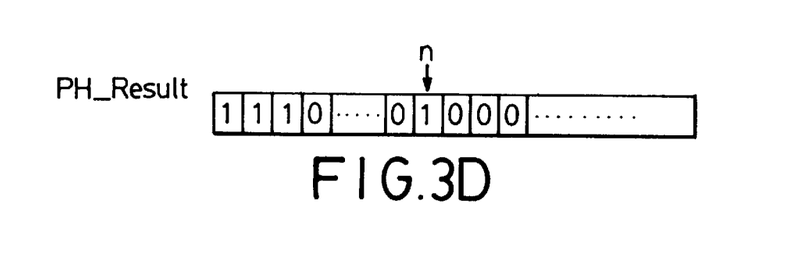
FIG. 3D is another schematic diagram illustrating how the shortest length record array shown in FIG. 3C is updated.

In step 1d, if it is found that the right position variable (RIGHT) is not less than the length variable (LENGTH), the flow proceeds to step 1f, where it is determined if the right position variable (RIGHT) is equal to the length variable (LENGTH). If the right position variable (RIGHT) is greater than the length variable (LENGTH), indicative of the fact that the active sampled data length corresponding to a current test phase division P(n) of the sampling pulses is greater than the observed shortest active sampled data length, the flow proceeds to step 1h. That is, no record is made in the nth entry of the record array (Ph_Result) at this time. If the right position variable (RIGHT) is equal to the length variable (LENGTH), indicative of the fact that the active sampled data length corresponding to the current test phase division P(n) of the sampling pulses is equal to the observed shortest active sampled data length, the flow proceeds to step 1g, where the nth entry of the record array (Ph_Result) is set to 1 (see FIG. 3D).

Figure 3E:
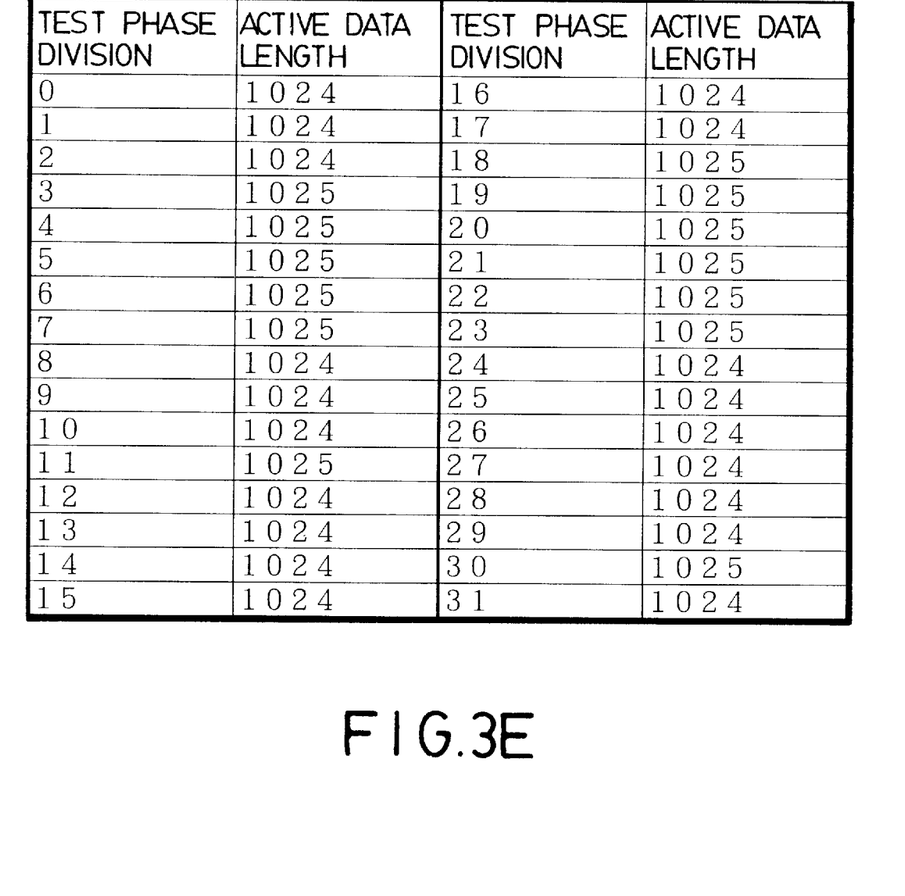
FIG. 3E is a test table illustrating the lengths of active sampled data in an illustrative example of the method of the preferred embodiment.
Figure 3F:
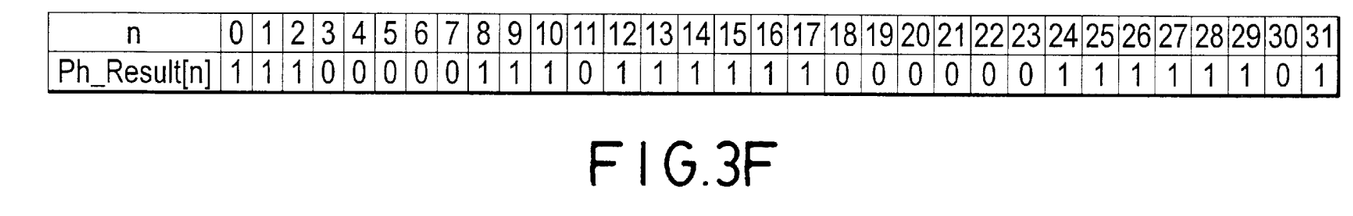
FIG. 3F is a schematic diagram illustrating the shortest length record array corresponding to the test table of FIG. 3E.

To help illustrate the remaining steps of the method of the preferred embodiment, FIG. 3E is a test table showing the lengths of active sampled data in an illustrative example of the method of the preferred embodiment. FIG. 3F is a schematic diagram illustrating the shortest length record array (Ph_Result) that is obtained after the first subroutine is performed based on the test table of FIG. 3E.

In the first subroutine, if it is determined in step 1b that the count variable (n) is no longer less than thirty-two, indicating that determination of the active sampled data lengths corresponding to all of the test phase divisions of the sampling pulses has been completed, the flow proceeds to a second subroutine.

Figure 4:
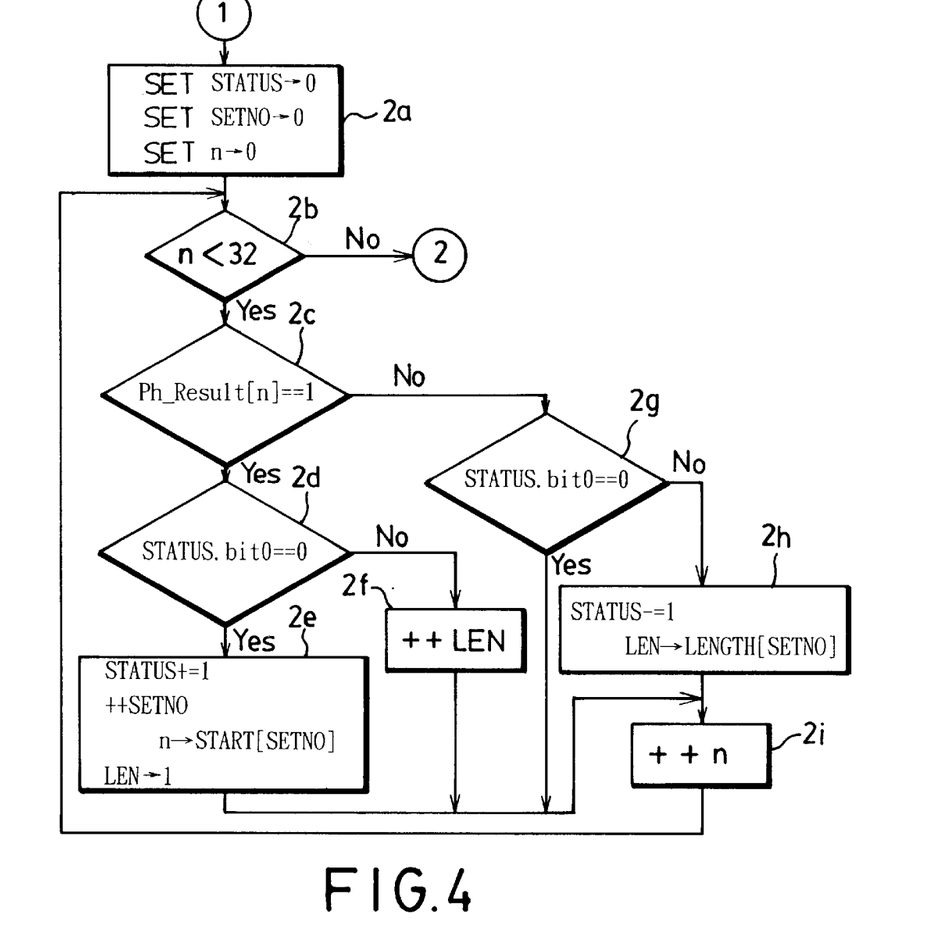
FIG. 4 is a flowchart of a second subroutine of the method of the preferred embodiment.

As shown in FIG. 4, the purpose of the second subroutine is to determine, from the results of the first subroutine, at least one set of consecutive ones of the test phase divisions that have the shortest active sampled data length corresponding thereto.

Initially, a status variable (STATUS), a set count variable (SETNO) and the test phase division count variable (n) are reset to 0 in step 2a. Thereafter, in step 2b, it is determined if the count variable (n) is less than thirty-two. If the count variable (n) is less than thirty-two, indicating that reading of all of the entries of the shortest length record array (Ph__Result) has yet to be completed, the flow proceeds to step 2c, where it is determined if an nth entry of the record array (Ph__Result) is set to 1. If the result in step 2c is no, the flow proceeds to step 2g, where it is determined if the status variable (STATUS) is 0. If the result in step 2g is yes, the flow proceeds to step 2i, where the count variable (n) is incremented by one, and then to step 2b in preparation for reading a succeeding entry of the record array (Ph__Result).

If it is determined in step 2c that the nth entry of the record array (Ph__Result) is set to 1, the flow proceeds to step 2d, where it is determined if the status variable (STATUS) is 0. If the result in step 2d is yes, indicating the detection of the start of a set of consecutive ones of the test phase divisions that have the shortest active sampled data length, step 2e is performed, where the status variable (STATUS) and the set count variable (SETNO) are each incremented by 1, the count variable (n) is recorded as the start of the detected set, and a set length variable (LEN) is set to 1. The flow subsequently proceeds to step 2i.

If it is determined in step 2d that the status variable (STATUS) is 1, indicating that the end of the detected set has not yet been detected, the flow proceeds to step 2f, where the set length variable (LEN) is incremented by 1 to continue counting of the length of the detected set, and then to step 2i.

If it is determined in step 2h that the status variable (STATUS) is 1, indicating that the end of the detected set has been found, the flow proceeds to step 2h, where the status variable (STATUS) is decreased by 1, and the set length variable (LEN) is recorded as the length of the detected set. The flow eventually proceeds to step 2i.

Figure 4A:
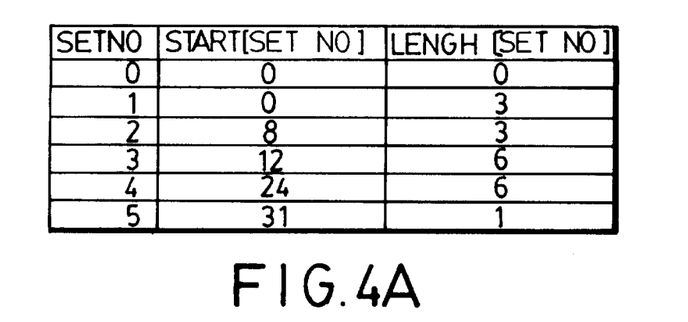
FIG. 4A is a table showing the starting position and length for detected sets in accordance with the shortest length record array of FIG. 3F.

FIG. 4A is a table showing the starting position and length for detected sets, the table being established in accordance with the shortest length record array of FIG. 3F.

In the second subroutine, if it is determined in step 2b that the count variable (n) is no longer less than thirty-two, indicating that all of the entries of the record array (Ph__Result) have been read, the flow proceeds to a third subroutine.

Figure 5:
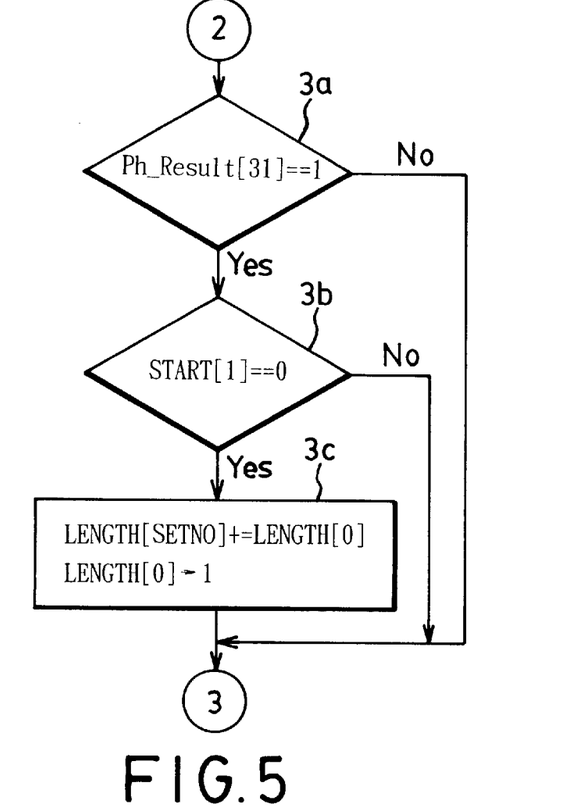
FIG. 5 is a flowchart of a third subroutine of the method of the preferred embodiment.

As shown in FIG. 5, the third subroutine is performed to adjust the length of a last one of the sets detected during the second subroutine when the first and last entries of the shortest length record array are set to 1.

Initially, in step 3a, it is determined if the last entry (Ph__Result [31]) of the record array is set to 1. If the result in step 3a is yes, the flow then proceeds to step 3b, where it is determined if the first entry (Ph__Result [0]) of the record array is set to 1. If the result in step 3b is yes, step 3c is performed to adjust the length of the last one of the detected sets by adding the length of the first one of the detected sets thereto, and to adjust the length of the first one of the detected sets to 1. The flow then proceeds to a fourth subroutine.

If the result in either of steps 3a and 3b is no, the flow automatically proceeds to the fourth subroutine.

Figure 5A:
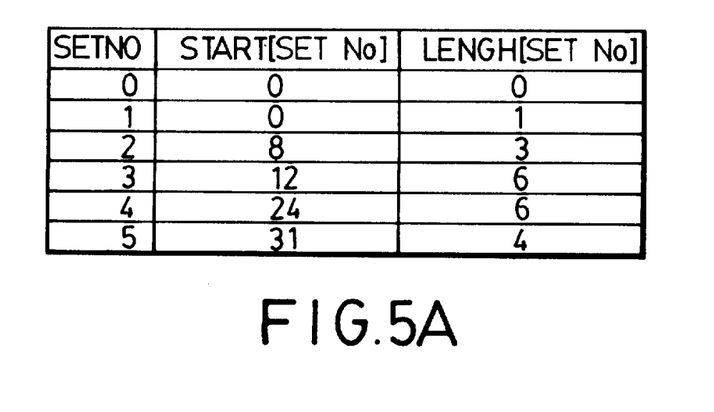
FIG. 5A is a table obtained from the table of FIG. 4A after the third subroutine is performed.

FIG. 5A illustrates a table obtained from the table of FIG. 4A after the third subroutine is performed.

Figure 6:
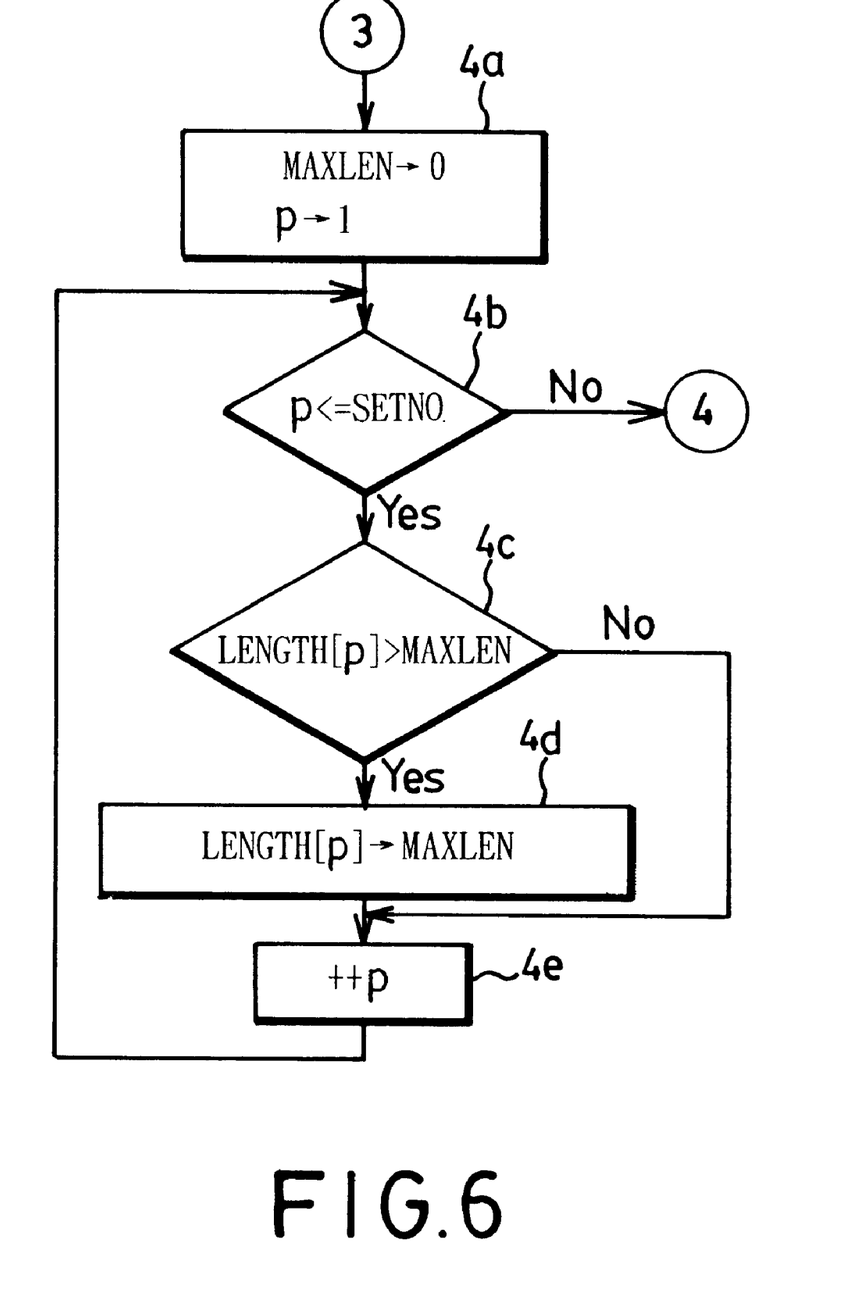
FIG. 6 is a flowchart of a fourth subroutine of the method of the preferred embodiment.

As shown in FIG. 6, the fourth subroutine is performed to determine the length of the longest one of the detected sets, i.e. the number of the consecutive ones of the test phase divisions in the longest one of the detected sets.

Initially, a maximum length variable (MAXLEN) and a count variable (p) are set to 1 in step 4a. Thereafter, in step 4b, it is determined if the count variable (p) is less than or equal to the total number of sets detected in the previous subroutines. If the result in step 4b is yes, step 4c is performed to determine if the length of a pth detected set is greater than the maximum length variable (MAXLEN). If the result in step 4c is yes, the flow proceeds to step 4d, where the maximum length variable (MAXLEN) is replaced by the length of the pth detected set. Thereafter, the count variable (p) is incremented by 1 in step 4e, and the flow goes back to step 4b.

If the length of the pth detected set is determined in step 4c to be less than or equal to the maximum length variable (MAXLEN), the flow immediately proceeds to step 4e. If it is determined in step 4b that the count variable (p) is greater than the total number of the detected sets, indicating that the length of the longest one of the detected sets has been determined, the flow proceeds to a fifth subroutine.

Figure 7:
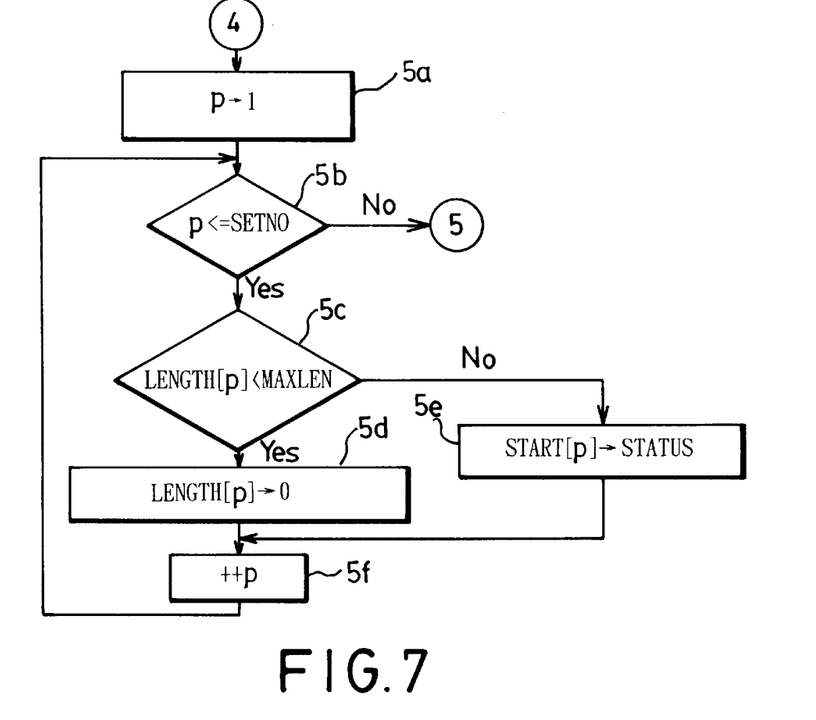
FIG. 7 is a flowchart of a fifth subroutine of the method of the preferred embodiment.

As shown in FIG. 7, the fifth subroutine is performed to record the starting position of the longest one of the detected sets.

Initially, the count variable (p) is set to 1 in step 5a. Thereafter, it is determined if the count variable (p) is less than or equal to the total number of the detected sets in step 5b. If the result in step 5b is yes, step 5c is performed to determine if the length of a pth detected set is less than the maximum length variable (MAXLEN). If the result in step 5c is yes, the flow proceeds to step 5d, where the length of the pth detected set is set to 0. The flow subsequently proceeds to step 5f, where the count variable (p) is incremented by 1, and then back to step 5b.

If it is determined in step 5c that the length of the pth detected set is not less than the maximum length variable (MAXLEN), step 5e is performed so that the starting position (START [p]) of the pth detected set is loaded into the status variable (STATUS). Step 5f is performed thereafter.

If it is determined in step 5b that the count variable (p) is greater than the total number of detected sets, indicating that the starting position of the longest one of the detected sets has been recorded in the status variable (STATUS), the flow proceeds to a sixth subroutine.

At the end of the fifth subroutine, if there are two or more longest ones of the detected sets, i.e. two or more of the detected sets include the largest number of the consecutive ones of the test phase divisions, only the starting position of the lattermost one of the longest detected sets is recorded in the status variable (STATUS).

Thus, for the table shown in FIG. 5A, the status variable (STATUS) is 24, while the maximum length variable (MAXLEN) is 6 after performing the fifth subroutine.

Figure 8:
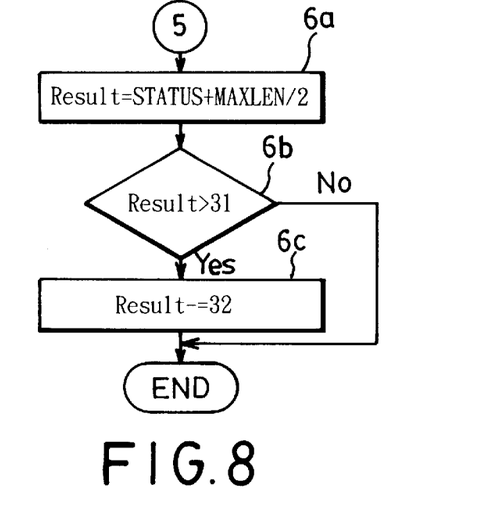
FIG. 8 is a flowchart of a sixth subroutine of the method of the preferred embodiment.

As shown in FIG. 8, the sixth subroutine is performed to determine an optimum test phase from the results of the fifth subroutine.

Initially, step 6a is performed to obtain an optimum test phase (RESULT) by adding one-half of the maximum length variable (MAXLEN) to the status variable (STATUS). In step 6b, it is determined if the optimum test phase (RESULT) is greater than 31. If the result in step 6b is yes, step 6c is performed to subtract thirty-two, which is the number of test phase divisions set for each sampling pulse, from the optimum test phase (RESULT) to obtain an adjusted final result. If the result in step 6b is no, the sixth subroutine is terminated, and the optimum test phase (RESULT) serves as the final result.

The final result obtained in the sixth subroutine is the central one of the test phase divisions in the longest detected set that includes the largest number of the consecutive ones of the test phase divisions having the shortest active sampled data length. Thus, for the table shown in FIG. 5A, the optimum test phase (RESULT) is equal to 27.

The result of the sixth subroutine is provided to the sampling circuit 20 so as to enable the latter to perform sampling phase adjustment based on the optimum test phase result (RESULT) in a known manner.

It has thus been shown that the present invention provides a fast and convenient method for automatic adjustment of the sampling phase to obtain pictures of clear quality since there is no need for a particular reference image during adjustment. The object of the present invention is thus met.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

We claim:

1. A method for automatic adjustment of sampling phase, comprising:

(a) setting a predetermined number of test phase divisions for each of a plurality of sampling pulses from a sampling circuit;

(b) controlling the sampling circuit to sample an analog test signal within a sampling period using the sampling pulses, determining an active sampled data length corresponding to each of the test phase divisions of the sampling pulses by detecting start and end of the analog test signal for each of the test phase divisions of the sampling pulses, and detecting at least one set of consecutive ones of the test phase divisions that have a shortest active sampled data length corresponding thereto;

(c) determining an optimum test phase as a central one of the test phase divisions in the detected set that includes a largest number of the consecutive ones of the test phase divisions; and (d) providing the optimum test phase to the sampling circuit to enable the sampling circuit to perform sampling phase adjustment based on the optimum test phase received thereby.

2. The method of claim 1, further comprising, between steps (b) and (c), adjusting the number of the consecutive ones of the test phase divisions in a last one of the detected sets by adding the number of the consecutive ones of the test phase divisions in a first one of the detected sets thereto when the active sampled data lengths corresponding to first and last ones of the test phase divisions of the sampling pulses are equal to the shortest active sampled data length.

3. The method of claim 1, wherein, in step (c), when two or more of the sets detected in step (b) include the largest number of the consecutive ones of the test phase divisions, the optimum test phase is determined as the central one of the test phase divisions in a lattermost one of the detected sets that include the largest number of the consecutive ones of the test phase divisions.

4. The method of claim 1, further comprising, between steps (c) and (d), adjusting the optimum test phase obtained in step (c) by subtracting the predetermined number of the test phase divisions from the optimum test phase when the optimum test phase is greater than the predetermined number of the test phase divisions, the adjusted optimum test phase being subsequently provided to the sampling circuit in step (d).

5. The method of claim 1, wherein the sampling period is a horizontal scan line period.

6. The method of claim 1, wherein the analog test signal is a video signal.

* * * * *